(12) United States Patent
Makino et al.

(10) Patent No.: US 8,487,191 B2
(45) Date of Patent: Jul. 16, 2013

(54) FLEXIBLE LAMINATE AND FLEXIBLE ELECTRONIC CIRCUIT BOARD FORMED BY USING THE SAME

(75) Inventors: Nobuhito Makino, Ibaraki (JP); Hajime Inazumi, Ibaraki (JP); Taku Yoshida, Ibaraki (JP)

(73) Assignee: JX Nippon Mining & Metals Corporation, Tokyo (JP)

( * ) Notice: Subject to any disclaimer, the term of this patent is extended or adjusted under 35 U.S.C. 154(b) by 252 days.

(21) Appl. No.: 13/141,730

(22) PCT Filed: Dec. 22, 2009

(86) PCT No.: PCT/JP2009/071285
§ 371 (c)(1),
(2), (4) Date: Jun. 29, 2011

(87) PCT Pub. No.: WO2010/074056
PCT Pub. Date: Jul. 1, 2010

(65) Prior Publication Data
US 2012/0012367 A1    Jan. 19, 2012

(30) Foreign Application Priority Data

Dec. 26, 2008  (JP) ................................. 2008-334565
Feb. 10, 2009  (JP) ................................. 2009-028203

(51) Int. Cl.
*H05K 1/00*  (2006.01)
*B32B 15/08*  (2006.01)

(52) U.S. Cl.
CPC ....................................... *B32B 15/08* (2013.01)
USPC .......................................... 174/254; 174/256

(58) Field of Classification Search
CPC ........................................................ B32B 15/08
USPC ................. 174/254, 255, 256, 258–260, 268; 29/825, 829; 205/88, 181, 165, 926; 257/750, 257/751, 753, 781, 767, 768
See application file for complete search history.

(56) References Cited

U.S. PATENT DOCUMENTS

| | | | |
|---|---|---|---|
| 5,484,517 A | * | 1/1996 | Hopson, Jr. ..................... 205/88 |
| 6,146,480 A | | 11/2000 | Centanni et al. |
| 6,171,714 B1 | | 1/2001 | Bergkessel et al. |
| 6,224,951 B1 | | 5/2001 | Centanni et al. |
| 6,277,211 B1 | * | 8/2001 | Panchanathan et al. ...... 148/101 |
| 6,638,642 B2 | | 10/2003 | Kitano et al. |

(Continued)

FOREIGN PATENT DOCUMENTS

| | | |
|---|---|---|
| JP | 06-120630 A | 4/1994 |
| JP | 07-197239 A | 8/1995 |

(Continued)

*Primary Examiner* — Yuriy Semenenko
(74) *Attorney, Agent, or Firm* — Howson & Howson LLP

(57) ABSTRACT

An adhesive-free flexible laminate formed from a polyimide film in which at least one surface has been plasma treated, a tie-coat layer formed on the surface of the plasma-treated polyimide film, a metal seed layer made of either copper or copper alloy and which is formed on the tie-coat layer, and a metal conductive layer made of either copper or copper alloy and which is formed on the metal seed layer, wherein the atomic percent of Cu inclusion in the tie-coat layer is 0.5 at % or less. Consequently, provided is a flexible laminate capable of effectively inhibiting the deterioration of the peel strength upon producing a flexible laminate (in particular a two-layer metalizing laminate).

8 Claims, 3 Drawing Sheets

U.S. PATENT DOCUMENTS

| | | |
|---|---|---|
| 6,824,827 B2 | 11/2004 | Katsuki et al. |
| 6,833,198 B2 | 12/2004 | Sakamoto et al. |
| 6,835,241 B2 | 12/2004 | Tsuchida et al. |
| 6,960,391 B2 | 11/2005 | Natsume et al. |
| 7,038,318 B2 * | 5/2006 | Iyer et al. .................. 257/768 |
| 7,067,742 B2 * | 6/2006 | DiStefano et al. ............ 174/261 |
| 7,341,796 B2 | 3/2008 | Hanafusa |
| 7,507,434 B2 * | 3/2009 | Cho et al. .................... 427/96.1 |
| 2001/0030122 A1 | 10/2001 | Hara et al. |
| 2002/0177000 A1 | 11/2002 | Katsuki et al. |
| 2002/0182432 A1 | 12/2002 | Sakamoto et al. |
| 2004/0040148 A1 * | 3/2004 | DeMaso et al. ................. 29/852 |
| 2004/0053019 A1 | 3/2004 | Yamamoto et al. |
| 2004/0163842 A1 | 8/2004 | Okada et al. |
| 2004/0209109 A1 | 10/2004 | Tsuchida et al. |
| 2005/0158574 A1 | 7/2005 | Suzuki et al. |
| 2006/0068184 A1 | 3/2006 | Hamada et al. |
| 2009/0162685 A1 | 6/2009 | Kobayashi et al. |
| 2009/0208762 A1 | 8/2009 | Akase |
| 2010/0018273 A1 | 1/2010 | Sato |
| 2010/0040873 A1 | 2/2010 | Kohiki et al. |
| 2010/0051451 A1 | 3/2010 | Sato |
| 2010/0212941 A1 | 8/2010 | Higuchi |
| 2010/0215982 A1 | 8/2010 | Kohiki et al. |
| 2010/0221563 A1 | 9/2010 | Kohiki et al. |
| 2010/0261033 A1 | 10/2010 | Moriyama et al. |
| 2010/0279069 A1 | 11/2010 | Hanafusa |
| 2010/0323215 A1 | 12/2010 | Makino |
| 2011/0003169 A1 | 1/2011 | Makino et al. |

FOREIGN PATENT DOCUMENTS

| | | |
|---|---|---|
| JP | 09-055575 A | 2/1997 |
| JP | 09-083134 A | 3/1997 |
| JP | 3258296 B2 | 2/2000 |
| JP | 2005-067145 A | 3/2005 |

* cited by examiner

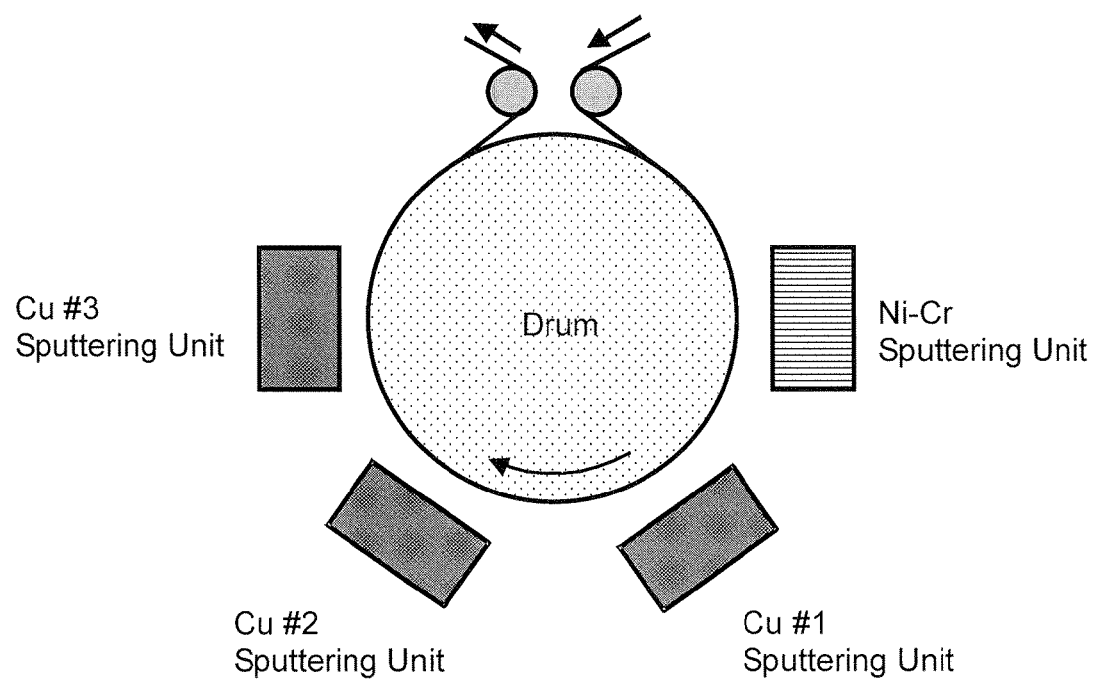
Fig. 1: Diagram of Sputtering Device

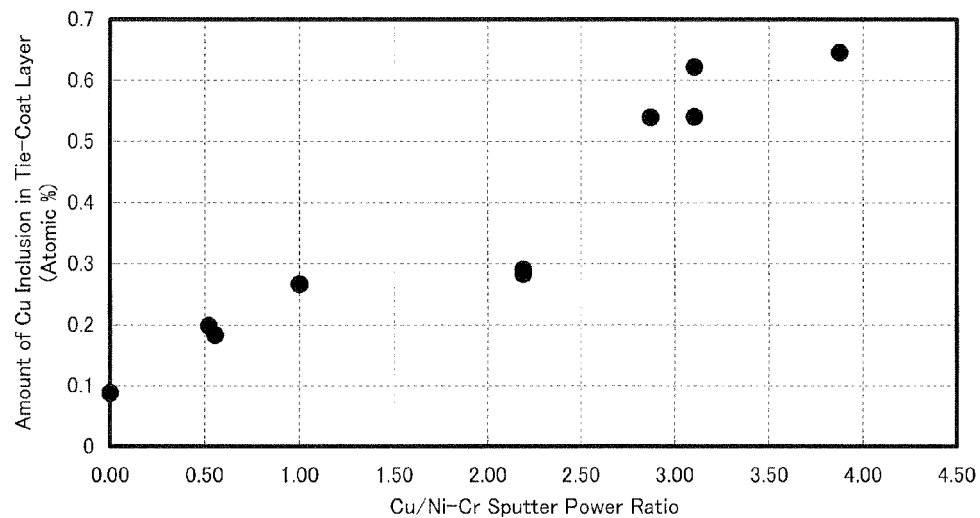
Fig. 2: Relationship of Sputtering Unit Power and Cu Inclusion
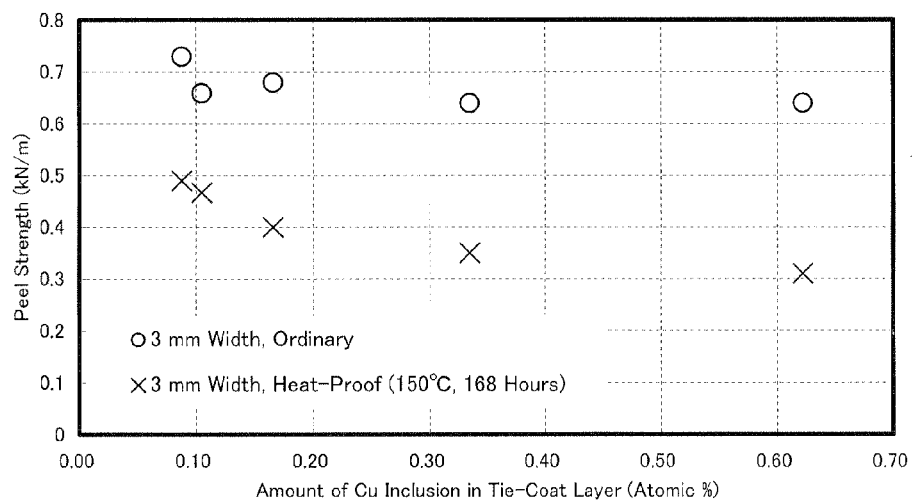
Fig. 3: Influence of Cu Inclusion to Peeling in Kapton-150EN

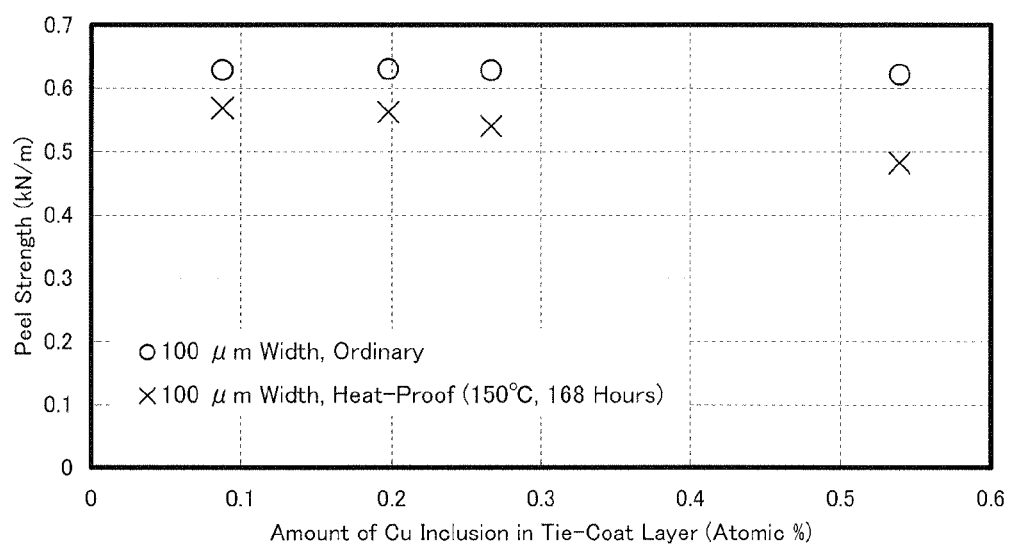
Fig. 4: Influence of Cu Inclusion to Peeling in Upilex-35SGA (100 μm Width)

FLEXIBLE LAMINATE AND FLEXIBLE ELECTRONIC CIRCUIT BOARD FORMED BY USING THE SAME

BACKGROUND OF THE INVENTION

The present invention relates to a flexible laminate used as a packaging material for electronic parts such as TAB and COF, and in particular relates to an adhesive-free flexible laminate.

An FCCL (Flexible Copper Clad Laminate), in which metal conductor layers primarily formed from copper are laminated on a polyimide film, is broadly used as a circuit board material in the electronics industry. Among the above, an adhesive-free flexible laminate substrate (particularly a two-layer metalizing laminate) that does not include an adhesive layer between a polyimide film and a metal layer is a material that is catching attention on demand of finer pitches of the circuit wiring width.

As a method of producing a flexible laminate substrate; particularly an adhesive-free flexible laminate substrate capable of accommodating fine pitches, primarily performed is a so-called metalizing method of forming, in advance, a tie-coat layer configured from a material having favorable adhesion with polyimide on a polyimide film by a drying method such as sputtering, CVD, or vapor deposition and a metal seed layer as a conductor of the cathode/current in the subsequent electroplating process, and thereafter forming a metal layer film to become the conductor layer of the circuit board by way of electroplating (refer to Patent Document 1).

In this metalizing method, in order to increase the adhesion between the metal layer and the polyimide film, modification is carried out by performing plasma treatment to the polyimide film surface in order to eliminate the contaminants on the surface and to improve the surface roughness prior to forming the metal layer (refer to Patent Document 2 and Patent Document 3).

Generally speaking, in the metalizing method, when preforming a metal layer on a polyimide film by a dry plating method such as sputtering, the improvement of adhesion and etching properties is being sought through the selection of the interlayer material (refer to Patent Document 4). Moreover, proposed is technology of sputtering a material selected from nickel, chromium, molybdenum, tungsten, vanadium, titanium and manganese on a polyimide film, subsequently sputtering a copper layer of approximately 50 nm, and further electroplating a copper layer of 1 μm or more (refer to Patent Document 5).

If copper and polyimide come in direct contact in the FCCL (Flexible Cupper Clad Laminate) in which the copper and a film such as a polyimide film are bonded; it is well-known that the peel strength will deteriorate. Thus, proposals have been made, as with Patent Document 6, to provide between the organic film and the copper layer an intermediate layer (tie-coat layer) possessing superior bondability with an organic film and which is capable of inhibiting the diffusion of copper.

However, the peel strength still deteriorated even with a tie-coat layer for inhibiting the diffusion of copper, and it was necessary to determine the cause thereof.
[Patent Document 1] Japanese Patent No. 3258296
[Patent Document 2] Japanese Patent No. 3173511
[Patent Document 3] PCT (WO) 2003-519901
[Patent Document 4] Japanese Published Unexamined Patent Application No. H6-120630
[Patent Document 5] Japanese Published Unexamined Patent Application No. H7-197239
[Patent Document 6] Japanese Published Unexamined Patent Application No. H9-083134

SUMMARY OF THE INVENTION

An object of this invention is to provide a flexible laminate capable of effectively inhibiting the deterioration of the peel strength upon producing a flexible laminate (in particular a two-layer metalizing laminate).

In order to achieve the object, the present invention provides the following invention:
1) An adhesive-free flexible laminate formed from a polyimide film in which at least one surface has been plasma treated, a tie-coat layer formed on the surface of the plasma-treated polyimide film, a metal seed layer made of either copper or copper alloy and which is formed on the tie-coat layer, and a metal conductive layer made of either copper or copper alloy and which is formed on the metal seed layer, wherein the atomic percent of Cu inclusion in the tie-coat layer is 0.5 at % or less.
2) The adhesive-free flexible laminate according to 1) above, wherein the atomic percent of Cu inclusion in the tie-coat layer is 0.3 at % or less.
3) The adhesive-free flexible laminate according to 1) above, wherein the atomic percent of Cu inclusion in the tie-coat layer is 0.1 at % or less.
4) The adhesive-free flexible laminate according to any one of 1) to 3) above, wherein the tie-coat layer is made of one type among nickel, chromium, cobalt, nickel alloy, chromium alloy and cobalt alloy; and nickel, chromium or cobalt is the main component and has the greatest abundance ratio in the tie-coat layer.
5) The adhesive-free flexible laminate according to 4) above, wherein the tie-coat layer is made of an alloy of nickel and chromium, and the main component is Ni.
6) A flexible electronic circuit board formed by using the adhesive-free flexible laminate according to any one of 1) to 5) above.

The present inventors discovered that copper gets mixed into the tie-coat layer in the actual sputtering deposition process even though metal that does not contain copper is selected as the tie-coat layer, and that the deterioration of the peel strength can be inhibited by controlling the amount of copper that is contained in the tie-coat layer. Based on the foregoing discovery, the present invention yields superior effects of being able to inhibit the deterioration of the peel strength upon producing a flexible laminate (in particular a two-layer metalizing laminate).

BRIEF DESCRIPTION OF THE DRAWINGS

FIG. 1 is a schematic explanatory diagram of the sputtering device.
FIG. 2 is a graph showing the relationship of the sputtering unit power and Cu inclusion.
FIG. 3 is a graph showing the relationship of the amount of Cu inclusion and the peel strength in the case of using Kapton-150EN.
FIG. 4 is a graph showing the relationship of the amount of Cu inclusion and the peel strength in the case of using Upilex-35SGA.

DETAILED DESCRIPTION OF THE INVENTION

A specific example of the present invention is now explained. A flexible laminate substrate is produced by forming a tie-coat layer on at least one surface of a polyimide film, and additionally forming a metal conductive layer on said surface. Here, the polyimide film surface is subject to plasma treatment in order to remove the contaminants on the surface and modify the surface.

Subsequently, a tie-coat layer is formed on the modified polyimide surface and a metal seed layer is formed thereon via sputtering. And, a metal layer to become the conductive layer of the circuit board is formed via electroless plating or electrolytic plating.

As described, although one objective of the tie-coat layer formed on the polyimide surface is to inhibit the diffusion of copper, it is impossible to prevent copper from getting mixed into the tie-coat layer in the sputtering deposition process.

This mechanism is explained below. FIG. 1 shows the configuration of a roll-to-roll sputtering device that is generally used industrially upon producing the FCCL with the metalizing method. In FIG. 1, the film is continuously fed from right to left while being wrapped around a drum.

Taking examples of forming a Ni—Cr layer (Ni—Cr film) as the tie-coat layer and of additionally forming a Cu layer (Cu film), in FIG. 1, a Ni—Cr film is deposited and a Cu film is deposited thereon, continuously, by operating all sputtering units including the Ni—Cr sputtering unit and the plurality of Cu sputtering units.

The film thickness of the respective films is controlled by supplying the required power to the respective sputtering units relative to a predetermined film feeding rate.

The film thickness of the Ni—Cr film is desirably thick from the perspective of adhesiveness with polyimide and diffusion barrier of copper, but is desirably thin from the perspective of etching properties upon etching the FCCL and producing a electronic circuit board. In this respect, the Ni—Cr film is formed to have film thickness of approximately 5 to 50 nm, more preferably 10 to 30 nm.

Desirably, the intended film thickness of the Cu film to be subsequently deposited after the Ni—Cr film is thick for the Cu film to function as the conductive layer and cathode for the subsequent electrolytic plating process, but it is not realistic to make it too thick from the perspective of productivity. In this respect, the Cu film is generally formed to have a film thickness of 50 to 1000 nm, more preferably 150 to 500 nm. Nevertheless, it goes without saying that the foregoing film thickness can be adjusted as needed according to the intended objective.

Since the Ni—Cr film and the Cu film are deposited under the condition of feeding the films at the same rate, it is necessary to prepare a plurality of Cu sputtering units in order to obtain the foregoing intended film thickness of the respective films, and generally the number of Cu sputtering units required is two to six times the number of Ni—Cr sputtering units.

As the mechanisms of Cu getting mixed into the tie-coat layer in the sputtering process, there are the following two mechanisms.

(A) Inclusion in the Gas Phase

Sputtering is a process that is performed in a vacuum of approximately 0.5 Pa and, in this region of pressure; gas behaves as a molecular flow without viscosity. Thus, movement of the gas molecules is random.

The device is designed so that the metal atoms (Ni, Cr, Cu) sputtered from the target will basically head toward the drum/film. But, owing to the directionality being not very strong and such influence as scattering of gas molecules in sputtering a tabular target, the metal atoms will scatter in all directions though the amount is limited.

When the scattered Cu infiltrates the Ni—Cr sputtering region, it is considered that Cu gets mixed into the Ni—Cr film.

(B) Implantation of Cu Atoms in the Ni—Cr Film

The Ni—Cr film of the intended film thickness is already formed on the film surface at the time when it reaches the Cu sputtering region. Since the Cu atoms that were sputtered from the target possess high energy, the Cu atoms do not merely attach to the Ni—Cr film surface, but they may become implanted inside the Ni—Cr film.

In the case of mechanism (A) above, the inclusion of Cu can be completely prevented if the Ni—Cr target and the Cu target are separated. As evident from the device structure of FIG. 1, it is impossible to separate the two in an airproof manner since there is a rotating drum and a film that is wrapped thereon.

A certain level of partitioning is provided as a necessity (partition is omitted in FIG. 1); however, Ni—Cr and Cu are not completely separated in the space in the vicinity of the drum. Thus, it could be said that it is extremely difficult to completely inhibit the inclusion of Cu.

Although the following measures are not perfect solutions, as measures for reducing the level of Cu inclusion, considered may be lowering the power (sputtered amount) of the Cu sputtering unit adjacent to the Ni—Cr sputtering device and reducing the ratio of inclusion, and separating the distance between the Cu sputtering unit and the Ni—Cr sputtering unit as much as possible.

Among the above, in separating the distance between the Cu sputtering unit and the Ni—Cr sputtering unit, the existing devices must be remodeled; which is not realistic. Moreover, even with a newly produced device, it cannot be said that this is favorable because the device needs to be enlarged unnecessarily, a gap will be created after the deposition of the Ni—Cr film until the deposition of the Cu film, and the Ni—Cr film could become oxidized due to the gas remaining in the device or the moisture which is inevitably generated from the film.

A solution to prevent problem of mechanism (B) is lowering energy of the Cu atoms in the initial Cu sputtering unit after the deposition of the Ni—Cr film.

Since energy per sputtered Cu atom is basically proportional to the sputtering voltage, measures such as lowering the sputtering voltage may be taken. Specifically, measures such as lowering the input power, raising the sputtering pressure, and reinforcing the magnetic field of magnetron sputtering may be taken.

Among the foregoing measures, change of the sputtering pressure is not a condition that can be decided only from the perspective of inhibiting the Cu inclusion since it will affect the quality of the sputtered film, and the reinforcement of the magnetic field of magnetron sputtering tends to induce the deterioration in the usage efficiency of the target and also entails cost escalation.

Thus, it is effective for cases of both mechanisms (A) and (B) to lower the power of the Cu sputtering unit adjacent to the Ni—Cr sputtering unit. Since a plurality of Cu sputtering units are installed, the reduced power can be made up for with the power of the remaining Cu sputtering units, even if the power of the Cu sputtering unit adjacent to the Ni—Cr sputtering unit is lowered. Also there is an advantage in that it is not necessary to reduce the Cu film thickness.

As described above, it was explained that the tie-coat layer formed on the polyimide surface is formed for inhibiting the diffusion of copper but the inclusion of copper in the tie-coat layer in the sputtering deposition process cannot be avoided, and it was further explained that lowering the power of the Cu sputtering unit adjacent to the sputtering unit for forming the tie-coat layer is effective as the means for reducing the inclusion of copper in the tie-coat layer as much as possible.

In the foregoing case, the inclusion of copper in the tie-coat layer will not affect the deterioration of the peel strength if such inclusion is a small amount as shown in the ensuing Examples. Meanwhile, with respect to the effectiveness of lowering the power of the Cu sputtering unit adjacent to the sputtering unit for forming the tie-coat layer, there is a problem in that it cannot be decided across-the-board since it is affected by the size of the device and deposition conditions.

In this respect, by setting forth a threshold of the amount of Cu contained in the tie-coat layer relative to the main component M of the tie-coat layer regardless of size of the device or deposition conditions, it is possible to provide an adhesive-free flexible laminate capable of inhibiting the deterioration of the peel strength.

The amount of Cu contained in the tie-coat layer can be controlled by setting the power of the Cu sputtering unit adjacent to the sputtering unit for forming the tie-coat layer as shown in the ensuing Examples. However, what is important is the threshold of the amount of Cu contained in the tie-coat layer relative to the main component M of the tie-coat layer, and measures for reducing the inclusion of Cu according to the actual device configuration, conditions and other methods may also be taken as needed.

To begin with, the present invention is based on the discovery that copper gets mixed into the tie-coat layer in the actual sputtering deposition process even though metal that does not contain copper is selected as the tie-coat layer.

Accordingly, what is important is to know the detrimental range of the amount of copper contained in the tie-coat layer and to control the amount of copper so as to exclude such detrimental range, and thereby enable the inhibition of the deterioration of the peel strength upon producing a flexible laminate (in particular a two-layer metalizing laminate).

The line width of recent electronic circuit boards (especially for COF use) is becoming narrower, and there are many cases where such electronic circuit boards are easily affected by the etching process when the line width is narrow, and subject to the thermal load during the circuit design. Thus, it is also desirable to improve the peel strength under the foregoing conditions; that is, to improve the heat-proof heat strength in addition to the ordinary peel strength.

Accordingly, with the adhesive-free flexible laminate of the present invention; the atomic percent of Cu inclusion in the tie-coat layer is 0.5 at % or less. If this exceeds 0.5 at %, the effect of inhibiting the deterioration of the peel strength will be low. In particular, the atomic percent of Cu inclusion in the tie-coat layer is preferably 0.3 at % or less, and more preferably 0.1 at % or less.

The material to be used in the tie-coat layer is one type among nickel, chromium, cobalt, nickel alloy, chromium alloy and cobalt alloy, and desirably, the existence of copper as an impurity is low as possible, as a matter of course.

In all cases, nickel, chromium or cobalt is the main component and is the component with the greatest abundance ratio in the tie-coat layer.

Among the above, preferably, the tie-coat layer that is generally used is made of an alloy of nickel and chromium, and the main component is Ni.

The present invention additionally provides a flexible electronic circuit board formed by using the foregoing adhesive-free flexible laminate.

EXAMPLES

Examples of the present invention are now explained based on the foregoing results. These Examples are merely for facilitating the understanding of the invention and the present invention shall in no way be limited thereby. Namely, various modifications and other embodiments shall be included in the present invention.

Example 1

A polyimide film was set in a vacuum device and, after evacuation; the plasma treatment of polyimide was performed. Subsequently, a tie-coat layer and a metal seed layer were formed via sputtering.

The tie-coat layer was made of Ni-20 wt % Cr with a theoretical density of 25 nm, and the metal seed layer was made of 300 nm of Cu. Sputtering was performed based on the DC magnetron method under an Ar gas atmosphere at 0.5 Pa. One Ni—Cr sputtering unit and three Cu sputtering units were used, and the sum of powers of the three Cu sputtering units was adjusted to become constant.

Subsequently, a metal conductive layer (thickness of 8 μm) made of copper was formed on the foregoing metal seed layer via electrolytic plating in order to produce a two-layer metalizing laminate.

FIG. 2 is a plot diagram with the horizontal axis showing the power ratio of the mutually adjacent Ni—Cr sputtering unit and Cu sputtering unit in the operation thereof, and the vertical axis shows the amount of Cu that got mixed into Ni—Cr.

Here, the amount of Cu that got mixed into Ni—Cr was determined according to the following procedures. Foremost, the prepared FCCL was accurately cut into 5 cm squares, and its copper layer was removed with nitric acid to expose the Ni—Cr layer. Subsequently, the entire Ni—Cr layer was dissolved in 18 ml of 35% hydrochloric acid, diluted with deionized water to achieve a solution with a total content of 50 ml, and a solution for analyzing the Cu amount in Ni—Cr was prepared.

The Cu amount in this solution was subject to quantitative analysis using ICP-MS (Model SPQ-9700 manufactured by SII), and the ratio to the entire dissolved Ni—Cr was determined as the amount of Cu inclusion.

Power of the sputtering units and the film feeding rate were kept constant, and the power of the Cu sputtering unit adjacent to Ni—Cr was changed. Moreover, as described above, sum of the powers of the three Cu sputtering units was kept constant. The amount of copper inclusion increases gradually at 0.1 to 0.3 at % up to a range where the Cu/(Ni—Cr) sputtering power ratio is in the vicinity of 0.00 to 2.20, but it can be understood that amount of copper inclusion drastically increases from around 2.50 and exceeds 0.5 at %.

This Cu/(Ni—Cr) tendency is dependent only on the sputtering device/conditions, and needless to say, it is not dependent on the type of polyimide. In fact, similar tendencies were shown regardless of the type of polyimide film.

Increase in the numerical value of the horizontal axis of FIG. 2 means that the input power of the Cu sputtering unit adjacent to Ni—Cr is greater than the sputtering input power for forming the (Ni—Cr) tie-coat layer, and it can be understood that to reduce the input power of the Cu sputtering unit as much as possible is an effective means for inhibiting the inclusion of Cu.

Example 2

A two-layer metalizing laminate was produced based on the same process as Example 1 under these conditions, and the peel strength was measured, based on JISC6471 (Test methods of copper clad laminates for flexible electronic circuit boards).
Film: Kapton-150EN manufactured by Du Pont/Toray
Tie-coat: Ni-20 wt % Cr, 25 nm
Cu seed layer: 300 nm
Cu plating layer: 8 μm
Sample line width during peel measurement: 3 mm
Heat-proof aging condition: 150° C.×168 hours in the air FIG. 3 shows the measurements of the peel strength relative to the amount of Cu inclusion (Cu/Ni) in the Ni—Cr layer by using the polyimide film of Kapton-150EN manufactured by Du Pont/Toray.

Consequently, as shown in FIG. 3, with respect to the dependency of the amount of Cu inclusion in the measurement of the ordinary peel strength, the ordinary peel strength exceeded 0.7 kN/m when the amount of Cu inclusion in the Ni—Cr layer was 0.10 at % or less. Even when the amount of Cu inclusion in the Ni—Cr layer thereafter increased, the ordinary peel strength was still 0.6 kN/m or more, and it could be said that the influence was limited. Nevertheless, it can be understood that the amount of Cu inclusion in the Ni—Cr layer being 0.10 at % or less is effective in improving the ordinary peel strength.

Meanwhile, it was discovered that the amount of Cu inclusion in the Ni—Cr layer significantly affected the peel strength after heat-proof aging. Specifically, deterioration of the peeling strength after heat-proof aging was observed when the amount of Cu inclusion in the Ni—Cr layer reached 0.10 at %, and the peel strength after heat-proof aging became 0.4 kN/m or less with the amount of Cu inclusion at 0.30 at %. This tendency continued until the amount of Cu inclusion reached 0.50 at % and the peel strength after heat-proof aging gradually deteriorated and reached the vicinity of 0.3 kN/m.

The influence of the amount of Cu inclusion in the Ni—Cr layer was examined in this Example, but it was confirmed that similar results are obtained with a tie-coat layer made of other metals or alloys; that is, a tie-coat layer made of one type among nickel, chromium, cobalt, nickel alloy, chromium alloy and cobalt alloy; and nickel, chromium or cobalt is the main component.

Thus, it can be understood that the atomic percent of Cu inclusion in the tie-coat layer is preferably 0.5 at % or less, more preferably 0.3 at % or less, and most preferably 0.1 at % or less.

Although the line width in this Example is 3 mm, the line width of an actual electronic circuit board (especially for COF use) is narrow at several ten microns. Generally speaking, as the line width becomes narrow, the peel strength is more dependent on various conditions. So it can be understood that this condition which yields effects even at a line width of 3 mm is extremely effective.

Example 3

A two-layer metalizing laminate was produced based on the same process as Example 1 under the following conditions, and the peel strength was measured. The peel strength was measured based on JISC6471 (Test methods of copper clad laminates for flexible electronic circuit boards).
Film: Upilex-35SGA manufactured by Ube Industries
Tie-coat: Ni-20 wt % Cr, 25 nm
Cu seed layer: 300 nm
Cu plating layer: 8 μm
Sample line width during peel measurement: 100 μm
Heat-proof aging condition: 150° C.×168 hours in the air FIG. 4 shows the measurements of the peel strength relative to the amount of Cu inclusion (Cu/Ni) in the Ni—Cr layer by using the polyimide film of Upilex-35SGA manufactured by Ube Industries. As shown in FIG. 4, although there is hardly any change in the ordinary peel strength relative to the amount of Cu inclusion in the Ni—Cr layer, with respect to the heat-proof peel strength, the peel strength after heat-proof aging deteriorated gradually when the amount of Cu inclusion in the Ni—Cr layer was 0.10 at % to 0.30 at %, and the peel strength after heat-proof aging reached a level of being less than 0.5 kN/m when the amount of Cu inclusion exceed 0.50 at %.

The influence of the amount of Cu inclusion in the Ni—Cr layer was examined in this Example, but it was confirmed that similar results are obtained with a tie-coat layer made of other metals or alloys: that is, a tie-coat layer made of one type among nickel, chromium, cobalt, nickel alloy, chromium alloy and cobalt alloy; and nickel, chromium or cobalt is the main component.

Thus, it can be understood that the atomic percent of Cu inclusion in the tie-coat layer is preferably 0.5 at % or less, more preferably 0.3 at % or less, and the atomic percent of Cu inclusion in the tie-coat layer is most preferably 0.1 at % or less.

In particular, it was confirmed that the present invention is effective in improving the heat-proof peel strength. Since the peel strength becomes sensitive to various conditions as the line width becomes narrower, it is assumed that this tendency becomes more effective as the line width is reduced.

Since the present invention yields superior effects of being able to inhibit the deterioration of the peel strength upon producing a flexible laminate (in particular a two-layer metalizing laminate) by controlling the amount of copper contained in the tie-coat layer, it is effective as a circuit board in the electronics industry.

The invention claimed is:

1. An adhesive-free flexible laminate formed from a polyimide film in which at least one surface has been plasma treated, a tie-coat layer formed on the surface of the plasma-treated polyimide film, a metal seed layer made of either copper or copper alloy and which is formed on the tie-coat layer, and a metal conductor layer made of either copper or copper alloy and which is formed on the metal seed layer, wherein the atomic percent of Cu inclusion in the tie-coat layer is 0.5 at % or less.

2. The adhesive-free flexible laminate according to claim 1, wherein the atomic percent of Cu inclusion in the tie-coat layer is 0.3 at % or less.

3. The adhesive-free flexible laminate according to claim 1, wherein the atomic percent of Cu inclusion in the tie-coat layer is 0.1 at % or less.

4. The adhesive-free flexible laminate according to claim 3, wherein the tie-coat layer is made of one type among nickel, chromium, cobalt, nickel alloy, chromium alloy and cobalt alloy; and nickel, chromium or cobalt is the main component and has the greatest abundance ratio in the tie-coat layer.

5. The adhesive-free flexible laminate according to claim 4, wherein the tie-coat layer is made of an alloy of nickel and chromium, and the main component is Ni.

6. A flexible electronic circuit board comprising the adhesive-free flexible laminate according to claim 1.

7. The adhesive-free flexible laminate according to claim 1, wherein the tie-coat layer is made of nickel, chromium, cobalt, nickel alloy, chromium alloy or cobalt alloy, and nickel, chromium or cobalt is the main component of the tie-coat layer and is of the greatest atomic ratio in the tie-coat layer.

8. The adhesive-free flexible laminate according to claim 1, wherein the tie-coat layer is made of an alloy including nickel and chromium, and wherein a main component of the tie-coat layer is Ni.

* * * * *